US012750052B2

(12) United States Patent
Lin et al.

(10) Patent No.: US 12,750,052 B2
(45) Date of Patent: Sep. 29, 2026

(54) ANALOG FRONT-END CIRCUIT OF DISPLAY RECEIVER COMPATIBLE WITH MOBILE INDUSTRY PROCESSOR INTERFACE

(71) Applicant: Novatek Microelectronics Corp., Hsinchu (TW)

(72) Inventors: Sheng-Hua Lin, Taichung City (TW); Tzu-Cheng Yang, Hsinchu City (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 18/791,461

(22) Filed: Aug. 1, 2024

(65) Prior Publication Data

US 2026/0039291 A1 Feb. 5, 2026

(51) Int. Cl.
*H03K 17/56* (2006.01)

(52) U.S. Cl.
CPC .................................... *H03K 17/56* (2013.01)

(58) Field of Classification Search
CPC ........ H03K 17/56; G09G 5/005; G09G 5/006; G01R 19/00; G06F 30/32
See application file for complete search history.

(56) References Cited

U.S. PATENT DOCUMENTS 8,368,680 B2 * 2/2013 Hsu ...................... G09G 3/3696 345/215
10,009,199 B2 6/2018 Suzuki et al.
2003/0094985 A1 * 5/2003 Heo ................. H03K 3/356139 327/202
2003/0112056 A1 * 6/2003 Tanzawa ................ G11C 16/30 327/536
2005/0195669 A1 * 9/2005 Sim .......................... G11C 7/12 365/203
2017/0331651 A1 11/2017 Suzuki et al.
2020/0042264 A1 2/2020 Zheng et al.

FOREIGN PATENT DOCUMENTS

KR 100485130 B1 * 4/2005 ............. H03K 17/56
TW 201810996 3/2018
TW 202343399 11/2023

OTHER PUBLICATIONS

"Office Action of Taiwan Counterpart Application", issued on May 16, 2025, p. 1-p. 3.

* cited by examiner

*Primary Examiner* — Regis J Betsch
*Assistant Examiner* — Amit R Bhatia
(74) *Attorney, Agent, or Firm* — JCIPRNET

(57) ABSTRACT

Analog front-end (AFE) circuit of display receiver includes input pad, voltage detecting circuit, and switching circuit. The input pad may receive input signal of low power mode of Mobile Industry Processor Interface (MIPI) standard and input signal of high-speed mode of MIPI standard. Since voltage level of input signal of different modes are different, the voltage detecting circuit is configured to receive the input signal and generate control signal according to a voltage level of the input signal. The switching circuit is coupled to the voltage detecting circuit and between the input pad and the equalizer circuit. The switching circuit is configured to receive the input signal, and determine whether to pass the input signal from the input pad to the equalizer circuit according to the control signal, wherein the control signal includes two different voltage levels that are respectively corresponding to a high-speed mode and a low power mode.

13 Claims, 7 Drawing Sheets

ANALOG FRONT-END CIRCUIT OF DISPLAY RECEIVER COMPATIBLE WITH MOBILE INDUSTRY PROCESSOR INTERFACE

BACKGROUND

Technical Field

The invention relates to an analog front-end circuit of a signal receiver, and more specifically, an analog front-end circuit of a display receiver that is compatible with Mobile Industry Processor Interface (MIPI).

Description of Related Art

Interfaces between a processing unit and peripherals may be operated under different protocols to meet a certain bandwidth, power consumption, and signal integrity requirements. Taking Mobile Industry Processor Interface (MIPI) as an example, MIPI protocol includes C-physical layer mode (C-PHY) and D-physical layer mode (D-PHY). D-PHY/C-PHY combine high speed with low power consumption. An interface compatible with MIPI has capability of switching between a high-speed mode (HS mode) and a low power mode (LP mode). At receiving portion of MIPI compatible interface, the receiving portion propagates an input signal through different signal path based on the electrical properties of the input signal. Therefore, MIPI compatible interface would require different circuitries to propagates the input signal to a corresponding signal processing circuit. For example, an input signal of HS mode would have a smaller voltage swing as compared to an input signal of LP mode. In order to handle input signals of both HS mode and LP mode, the circuitry of the MIPI compatible interface would require electrical components that is capable of handling higher voltage swing of the input signal corresponding to the LP mode. As such, the hardware configuration of the MIPI compatible interface is limited.

Conventionally, the receiving portion of the MIPI compatible interface utilizes a multiplexer that switches the signal paths between circuits that handle the input signal of the LP mode and input signal of the HS mode. Since the multiplexer has to anticipate a wider voltage swing of the input signal in LP mode, the multiplexer would require utilization of electrical components that have higher voltage rating (or tolerance) in order to prevent damages such as overvoltage. These electrical components having higher voltage rating limit the physical dimension of the MIPI compatible interface.

SUMMARY

The invention is directed to a programming method, a memory storage device and a memory controlling circuit unit, which are capable of reducing errors generated by programming adjacent word lines.

In the embodiments of the disclosure, an analog front-end (AFE) circuit of a display receiver complying with Mobile Industry Processor Interface standard configured to receive an input signal includes an equalizer circuit, an input pad, a voltage detecting circuit and a switching circuit. The input pad receives the input signal. The voltage detecting circuit is coupled to the input pad, and is configured to receive the input signal and generate a control signal according to a voltage level of the input signal. The switching circuit is coupled to the voltage detecting circuit and between the input pad and the equalizer circuit, and is configured to receive the input signal, and determine whether to pass the input signal from the input pad to the equalizer circuit according to the control signal. The control signal includes two different voltage levels that are respectively corresponding to a high-speed mode and a low power mode.

In one of the embodiments, the voltage detecting circuit is configured to output the control signal whose voltage level indicates that the display receiver is in the low power mode when the voltage level of the input signal is higher than a first predetermined voltage, and output the control signal whose voltage level indicates that the display receiver is in the high-speed mode when the voltage level of the input signal is lower than to a second predetermined voltage. The switching circuit is configured to stop the input signal received from the input pad from being transmitted to the equalizer circuit in response to receipt of the control signal whose voltage level indicates that the display receiver is in the low power mode.

In one of the embodiments, the switching circuit includes a first transistor and a second transistor having a lower operation voltage with respect to the first transistor. The first transistor is coupled to the input pad for receiving the input signal, the second transistor is coupled between the first transistor and the equalizer circuit, and a control terminal of the first transistor and a control terminal of the second transistor are respectively coupled to the voltage detecting circuit.

In one of the embodiments, the AFE circuit further includes a body clamping circuit. The body clamping circuit includes a third transistor. The third transistor has a control terminal coupled to an output of the voltage detecting circuit and configured to clamp a body terminal of the second transistor to a voltage level at a first terminal of the second transistor according to the input signal.

In one of the embodiments, the body clamping circuit further includes a fourth transistor. The fourth transistor has a control terminal coupled to the output of the voltage detecting circuit and configured to clamp the body terminal of the second transistor to a ground according to the input signal.

In one of the embodiments, the equalizer circuit includes a plurality of fifth transistors having a lower operation voltage with respect to the first transistor.

In one of the embodiments, the voltage detecting circuit includes a voltage comparator configured to output an enable signal according to a voltage of the input signal and a predetermined reference voltage.

In one of the embodiments, the voltage detecting circuit further includes a level shift circuit configured to shift a voltage level of the control signal which is generated based on the input signal to an operation voltage range of at least one transistor included in the switching circuit.

In one of the embodiments, the AFE circuit further includes a high-speed receiving portion, a low power receiving portion and a voltage converter. The high-speed receiving portion includes the switching circuit and the equalizer. The low power receiving portion includes the voltage detecting circuit. The voltage converter is coupled between the voltage detecting circuit and the switching circuit and is configured to convert a voltage level of the control signal from first voltage level to second voltage level.

In one of the embodiments, the switching circuit includes a first transistor and a second transistor. The first transistor includes a control terminal coupled to an output of the voltage detecting circuit, a first terminal coupled to the input pad, and a second terminal. The second transistor includes a control terminal coupled to the output of the voltage detecting circuit, a first terminal coupled to the second terminal of the first transistor, and a second terminal coupled to the signal processing circuit. An operation voltage of the second transistor is lower than an operation voltage of the first transistor.

In one of the embodiments, the AFE circuit further includes a third transistor. The third transistor includes a control terminal directly connected to the control terminal of the second transistor, a first terminal coupled to the second terminal of the second transistor, and a second terminal coupled to a body terminal of the second transistor.

In one of the embodiments, the third transistor further includes a body terminal that is short-circuited with the second terminal of the third transistor.

In one of the embodiments, the AFE circuit further includes a third transistor. The third transistor includes a control terminal directly connected to the control terminal of the second transistor, a first terminal coupled to the first terminal of the second transistor, and a second terminal coupled to a body terminal of the second transistor.

In the embodiments of the disclosure, a signal receiver complying with Mobile Industry Processor Interface standard includes a plurality of input pads and a plurality of signal receiving circuits. Each of the signal receiving circuits is coupled to one of the input pads for receiving the input signal and each of the signal receiving circuits includes a lower power receiving portion and a high-speed receiving portion. The lower power receiving portion includes a voltage comparator configured to detect a voltage level of an input signal received from the corresponding input pad and generate a control signal based on the voltage level of the input signal and a predetermined voltage. The high-speed receiving portion is coupled to the corresponding input pad and includes an equalizer circuit and a switching circuit coupled between the corresponding input pad and the equalizer circuit. The switching circuit is configured to determine whether to pass the input signal received from the corresponding input pad to the equalizer circuit according to the control signal received from the voltage comparator in the lower power receiving portion. The lower power receiving portion is configured to process the input signal having a first voltage level, and the high-speed receiving portion is configured to process the input signal having a second voltage level lower than the first voltage level.

In one of the embodiments, the high-speed receiving portion is configured to stop the input signal received from the corresponding input pad being transmitted to the equalizer circuit when the voltage detecting circuit of the low power receiving portion determines the voltage level of the input signal being higher than a first predetermined voltage.

In one of the embodiments, the high-speed receiving portion is configured to pass the input signal received from the corresponding input pad to the equalizer circuit when the voltage detecting circuit of the low power circuit determines the voltage level of the input signal is lower than a second predetermined voltage.

In one of the embodiments, the input signal received from the plurality of input pads includes a differential signal and a trio signal. The low power receiving portion is configured to process the differential signal that is received through at least two input pads, and the high-speed receiving portion is configured to process the trio signal that is received through at least three input pads.

In one of the embodiments, the switching circuit includes a first transistor and a second transistor having a lower operation voltage with respect to the first transistor. The first transistor is coupled to the input pad for receiving the input signal, the second transistor is coupled between the first transistor and the equalizer, and a control terminal of the first transistor and a control terminal of the second transistor are coupled to the low power receiving portion.

In one of the embodiments, the switch circuit further includes a body clamping circuit. The body clamping circuit includes a third transistor. The third transistor has a control terminal coupled to an output of the low power receiving portion and configured to clamp a body terminal of the second transistor to a voltage level at a first terminal of the second transistor according to the input signal.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
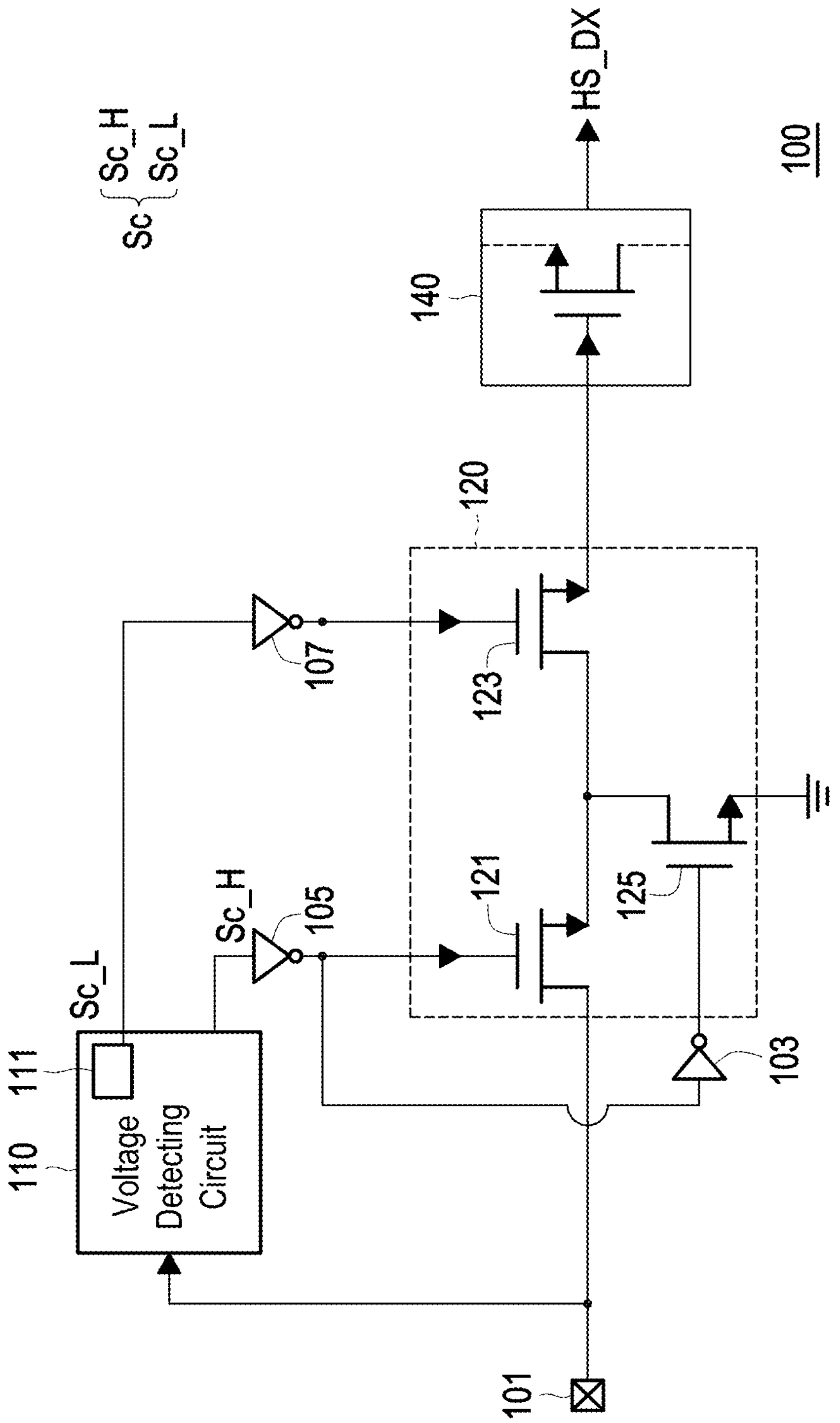
FIG. 1 is a diagram illustrating an analog front-end circuit of a display receiver according to an exemplary embodiment of the disclosure.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one," "one or more" and "and/or" are open-ended expressions that are both conjunctive and disjunctive in operation. For example, each of the expressions "at least one of A,B and C," "at least one of A, B, or C," "one or more of A, B, and C," "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In the disclosure, an analog front-end (AFE) circuit of a signal receiver is provided for receiving input signals having at least two different two different electrical characteristics such as different voltage levels. For example, Mobile Industry Processor Interface (MIPI) protocol defines two types of signal transmissions, i.e., low power mode and high-power mode. An input signal being transmitted under the low power mode has a wider voltage swing with respect to an input signal being transmitted under the high-speed mode. The AFE circuit of the disclosure includes a high-speed receiving portion for handling the high-speed input signal and a low power receiving portion for handling the low power input signal. Since each input pad of AFE circuit receives both input signals of low power mode and high-speed mode, the AFE circuit switches between the high-speed receiving portion and the low power input signal based on voltage level of the input signal, so as to provide an over-voltage protection in the high-speed receiving portion of the AFE circuit. The AFE circuit may reduce the physical dimension of electrical components in the high-speed receiving portion, since the input signal of the high-speed mode has a smaller voltage swing with respect to the input signal low-power mode. The reduction of the physical dimensions of the electrical components in the high-speed receiving portion also provides a lower power consumption and higher data rate. By using the switching circuit with over-voltage protection, the equalizer circuit may also be implemented by using core electrical components. As such, the signal receiver has advantages such as higher data rate, lower power consumption, and smaller size.

In one of the embodiments of the disclosure, the signal receiver refers to a display receiver. However, the disclosure is not limited thereto. The signal receiver may be any signal receiver that receives input signals having different electrical characteristics such as high-speed mode and low power mode in MIPI protocol.

FIG. 1 is a diagram illustrating an analog front-end (AFE) circuit 100 of a display receiver according to an exemplary embodiment of the disclosure. In FIG. 1, the AFE circuit 100 includes an input pad 101, a voltage detecting circuit 110, a switching circuit 120, and an equalizer circuit 140. The input pad 101 is coupled to the voltage detecting circuit 110 and the switching circuit 120, respectively. The voltage detecting circuit 110 is coupled between the input pad 101 and the equalizer circuit 140.

In the embodiment, the input pad 101 may receive an input signal having a signal characteristic of high-speed mode or an input signal having a signal characteristic of low power mode. The voltage detecting circuit 110 is coupled to the input pad 101 to receive the input signal. The voltage detecting circuit 110 detects a voltage level of the input signal to determine whether the input signal is an input signal having the signal characteristic of the high-speed mode or an input signal having the signal characteristic of the low power mode. Then, the voltage detecting circuit 110 generates a control signal which would be transmitted to the switching circuit 120 based on the determination. If the voltage detecting circuit 110 determines that the input signal received by the input pad 101 has a signal characteristic of high-speed mode, the control signal would enable the switching circuit 120 to pass the input signal from the input pad 101 to the equalizer circuit 140 by forming a signal path between the input pad 101 and the equalizer circuit 140. On the other hand, if the voltage detecting circuit 110 determines that the input signal received by the input pad 101 has the signal characteristic of low power mode, the control signal would disable the switching circuit 120 to block the input signal of the low power mode from the equalizer circuit 140 by cutting off the signal path between the input pad 101 and the equalizer circuit 140.

In the embodiment, the voltage detecting circuit 110 compares the voltage level of the input signal to a predetermined voltage, and then generates the control signal Sc according to the comparison result. For example, the voltage detecting circuit 110 is configured to output the control signal whose voltage level indicates that the display receiver is in the low power mode when the voltage level of the input signal is higher than a first predetermined voltage. On the other hand, the voltage detecting circuit 110 is configured to output the control signal whose voltage level indicates that the display receiver is in the high-speed mode when the voltage level of the input signal is lower than to a second predetermined voltage. The first and second predetermined voltages are selected to determine whether the input signal has signal characteristic of the low power mode or the high-speed mode. In the embodiment, the first predetermined voltage may be 0.74V, and the second predetermined voltage may be 0.55V, where 0.74V may be the minimum voltage regarded as logic high and 0.55V may be the maximum voltage regarded as logic low. However, the disclosure is not limited thereto. The values of the first and second predetermined voltages may be designed based on design requirements. In other embodiments, the first and second predetermined voltages may be other voltage values that protect the electrical components (e.g., transistors) having lower operation voltage at the high-speed receiving portion of the display receiver.

The switching circuit 120 includes a first transistor 121, a second transistor 123, and an isolation transistor 125. The first transistor 121 includes a first terminal, a second terminal and a control terminal. The first terminal of the first transistor 121 is coupled to the input pad 101 to receive the input signal. The second terminal may be directly or indirectly coupled to a first terminal of the second transistor 123. The control terminal is coupled to the voltage detecting circuit 110 through an inverter 105 to receive an inverted control signal Sc_H. The second transistor 123 includes a second terminal coupled to the equalizer circuit 140 and a control terminal coupled to the voltage detecting circuit 110 through an inverter 107 to receive an inverted control signal Sc_L. The isolation transistor 125 includes a first terminal coupled to a common node between the second terminal of the first transistor 121 and the first terminal of the second transistor 123, a second terminal coupled to a ground, and a control terminal coupled to the voltage detecting circuit 110.

In the embodiment, the first and second transistors 121, 123 are connected in series between the input pad 101 and the equalizer circuit 140. The inverted control signal Sc (e.g., Sc_H, Sc_L) turns on the first transistor 121 and the second transistor, 123 to form the signal path between the input pad 101 and the equalizer circuit 140 if the voltage level of the input signal is detected and determined to be smaller than the second predetermined voltage. On the other hand, if the voltage level of the input signal is greater than the first predetermined voltage, the control signal Sc turns off the first and second transistors 121, 123 to cut off the signal path between the input pad 101 and the equalizer 140.

The inverted control signal Sc is also coupled to the control terminal of the isolation transistor 125 through an inverter 103. While the control signal Sc turns off the first and second transistors 121, 123, the inverter 103 would invert the inverted control signal Sc, and the inverted control signal Sc turns on the isolation transistor 125 to couple the common node between the first and second transistors 121, 123 to the ground. In the embodiments of the disclosure, the control signal Sc (including Sc_H, Sc_L) may be referred to as the control signal or the inverted control signal for the purpose of brevity. Those skilled in the art would understand the control signal Sc is to enable or disable the transistors to which the control signal Sc is coupled to, and the polarity of the control signal may be inverted or non-inverted based on the design requirement.

The equalizer circuit 140 includes a plurality of transistors and is configured to process the input signal. In the embodiment, the equalizer circuit 140 may be a continuous-time linear equalizer (CTLE) for processing the input signal having the signal characteristic of high-speed mode.

The configuration of AFE circuit 100 provides an over-voltage protection. For example, if the voltage level of the input signal at the input pad 101 is determined to be higher than the first predetermined voltage (i.e., input signal of low power mode), the voltage detecting circuit 110 would turn off the first transistor 121 for cutting off the signal path and turns on the isolation transistor 125 to short the signal path to the ground. The AFE 100 may prevent the input signal that has a higher voltage level from reaching the second transistor 123 and other transistors thereafter. With the over-voltage protection, the second transistor 123 and the equalizer circuit 140 may be implemented by using transistors that have a smaller physical dimension and/or lower operation voltage as compared to the first transistor 121. As such, the physical dimension of the AFE 100 may be reduced. The reduction of physical dimension and/or the operation voltage of AFE 100 would also results in advantages such as lower power consumption and higher data rate.

Since requirement of the operation voltage of the second transistor 123 is lower voltage, the voltage detecting circuit 110 would also adjust the voltage level of the control signal Sc for controlling the second transistor 123. In the embodiment, the voltage detecting circuit 110 would also include a voltage level shifter 111 that shifts the voltage level of the control signal Sc to a lower voltage level to provide the over-voltage protection to the second transistor 123. With reference to FIG. 1, the control signal Sc includes a first control signal Sc_H and a second control signal Sc_L having a lower voltage level with respect to the first control signal Sc_H. The inverted first control signal Sc_H is coupled to the control terminals of the first transistor 121 and the isolation transistor 125, and the inverted second control signal Sc_L is coupled to the control terminal of the second transistor 123.

In the embodiment of FIG. 1, the voltage level shifter is included in the voltage detecting circuit 110. However, the disclosure is not limited thereto. In other embodiments, such as FIG. 2B, the AFE may further includes a voltage converter 211 that shifts the voltage level of the control signal. In the embodiment of FIG. 2B, the voltage detecting circuit 110 outputs a first control signal Sc_H to the voltage converter 211, where the voltage converter 211 converts the voltage level of the control signal Sc_H to a second control signal Sc_L having a lower voltage level with respect to the first control signal Sc_H.

Based on at least the configuration described above, the over-voltage protection of the AFE circuit allows the AFE circuit to utilize transistors having low operation voltage and/or physical dimension in a signal path that is downstream to the first transistor. The advantages such as power consumption and higher data rate may also be achieved.

Figure 2A:
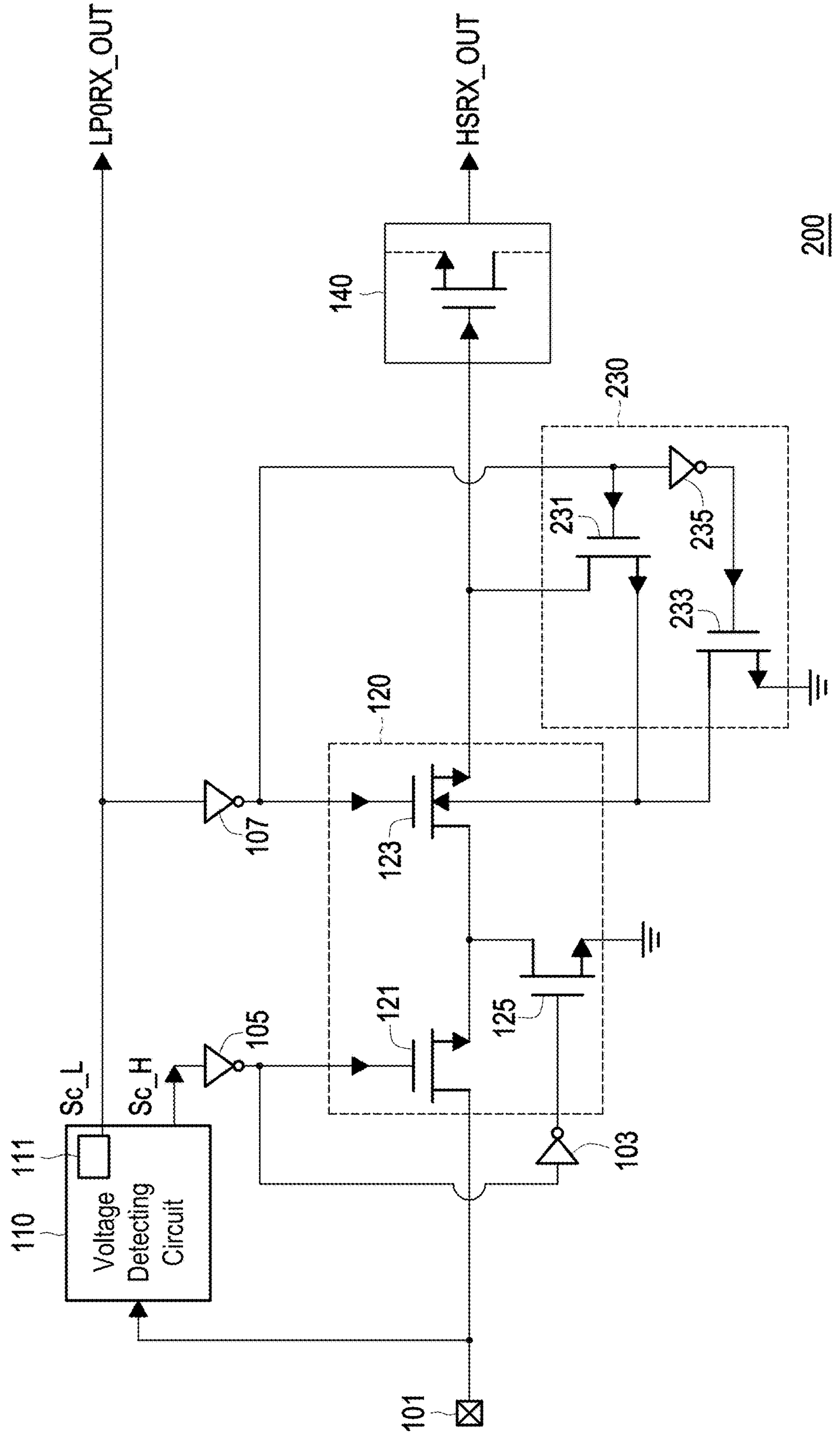
FIG. 2A is a diagram illustrating an analog front-end circuit of a display receiver according to an exemplary embodiment of the disclosure.
Figure 2B:
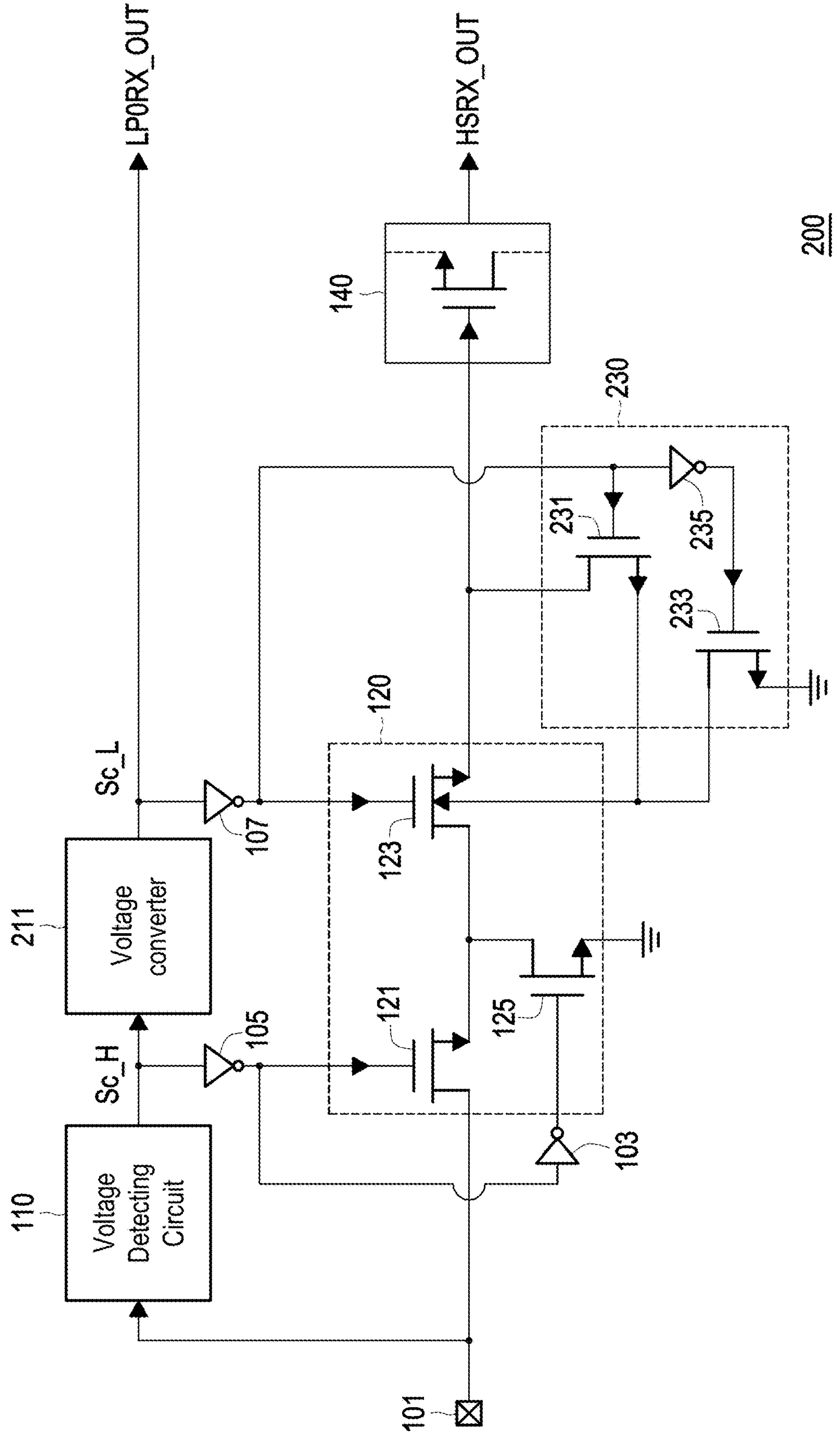
FIG. 2B is a diagram illustrating an analog front-end circuit of a display receiver according to an exemplary embodiment of the disclosure.

FIG. 2A is a diagram illustrating an analog front-end circuit 200 of a display receiver according to an exemplary embodiment of the disclosure. The structures and operations of the voltage detecting circuit 110, the switching circuit 120, and the equalizer 140 are similar to FIG. 1 as described above, and thus the description would not be repeated here. In addition to the over-voltage protection as described for the embodiment of FIG. 1, the AFE circuit 200 further includes a body clamping circuit 230, as to further provide over-voltage protection to the second transistor 123. In the embodiment, the body clamping circuit 230 is coupled to a body terminal and the second terminal of second transistor 123 included in the switching circuit 120 to minimize the potential difference between the first and body terminals of the second transistor 123. The body clamping circuit 230 includes a third transistor 231, a fourth transistor 233 and an inverter 235. The third transistor 231 includes a first terminal coupled to the second terminal of the second transistor 123, a second terminal coupled to the body terminal of the second transistor 123, and a control terminal coupled to the inverted second control signal Sc_L. The fourth transistor 233 includes a first terminal coupled to the body terminal of second transistor 123, a second terminal coupled to the ground potential of the AFE circuit 200, and a control terminal coupled to the second control signal Sc_L. In the embodiment, the third and fourth transistors 231, 233 are transistors having a lower operation voltage with respect to the first transistor 121 of the switching circuit 120. Thus, similar to the second transistor 123 and fifth transistors of the equalizer circuit 140, the third and fourth transistors 231, 233 also has a smaller physical dimension and lower power consumption with respect to the second transistor 123.

In a case of potential over-voltage situation due to an input signal having a voltage level higher than the operation voltage of the second transistor 123 being passed to the second transistor 123, the body clamping circuit 230 is configured to clamp the body terminal of the second transistor 123 to a voltage level at the first terminal of the second transistor 123, so that the potential difference between the first and body terminals of the second transistor 123 may be reduced. The situation may occur due to failure or slow response of voltage detecting circuit 110 and the likes, which allows an input signal having a higher voltage level (such as input signal of low power mode) to reach the second transistor 123.

As described in one of the embodiments, the switching circuit 120 has a normally open configuration, where the signal path are formed by the first and second transistors 121, 123 until the first and second control signals Sc_L, Sc_H are generated by the voltage detecting circuit 110 to cut off the signal path. However, in some cases, the input signal of the low power mode may be passed to the second transistor 123 due to failure or slow response of the voltage detecting circuit 110. For example, when an input signal of the low power mode, which has a voltage level of 1.32V, is received at the input pad 101 and the voltage detecting circuit 110 erroneously generate an output signal having a logic low level, the inverter 105 and the inverter 107 may erroneously output voltages of logic high level, such as 1.8V to the gate terminal of the transistor 121 and 0.9V to the gate terminal of the transistor 123, and as result the input signal (1.32V) may be passed to the first terminal of the second transistor 123 through the first transistor 121, wherein the transistors 121 and 123 are turned on. Under such situation, the third transistor 231 would be turned on and the fourth transistor 233 would be turned off based on the inverted second control signal Sc_L. The third transistor 231 would clamp the body terminal of the second transistor 123 to the second terminal (e.g., source terminal) of the second transistor 123, for example, source and bulk short. In such case, the potential difference between the first and second terminals of the second transistor 123 maintains within the operation voltage of the second transistor 123. Therefore, the second transistor 123 and other transistors coupled at the downstream of the signal path may be protected from over-voltage even if the voltage detecting circuit malfunctions. The voltage values used above are for comprehending the concept of the disclosure, they are not intended to limit the disclosure to a specific value.

When the input signal is determined to be an input signal of high-speed mode, the input signal would be passed to the second transistor 123 of the switching circuit 120 and the equalizer circuit 140. The third transistor 231 would be turned on.

Moreover, the second control signal Sc_L output by the voltage detecting circuit 110 is an input signal of the low power mode LP0RX_OUT and transmitted to a processing circuit for processing of low power mode signal. In the embodiment, the voltage detecting circuit 110 is part of low power receiving portion that is already included in the AFE circuit for receiving the input signal of the low power mode. The second control signal Sc_L is an output of the lower power receiving portion. That is, the embodiment uses the existing circuitry in the low power receiving portion to detect the voltage level of the input signal. As compared to conventional MIPI compatible receivers, additional connections are used to tap into the output of this existing circuitry for detecting the voltage level of the input signal. In the embodiment, the input signal passes to the equalizer circuit 140 would be the input signal of the high-speed mode HSRX_OUT and transmitted to other processing unit.

FIG. 2B is a diagram illustrating an analog front-end circuit 200 of a display receiver according to an exemplary embodiment of the disclosure. The embodiment shows an alternative way for converting the voltage level of the input signal to a lower voltage that is within the operation voltage of the second transistor 123. Instead of having a voltage level shifter within the voltage detecting circuit 110, the embodiment of FIG. 2B illustrates a voltage converter 211 may be coupled between the switching circuit 120 and the voltage detecting circuit 110. The structures and operations of the voltage detecting circuit 110, the switching circuit 120, and the equalizer 140 are similar to FIG. 1 as described above, and thus the description would not be repeated here.

Figure 3:
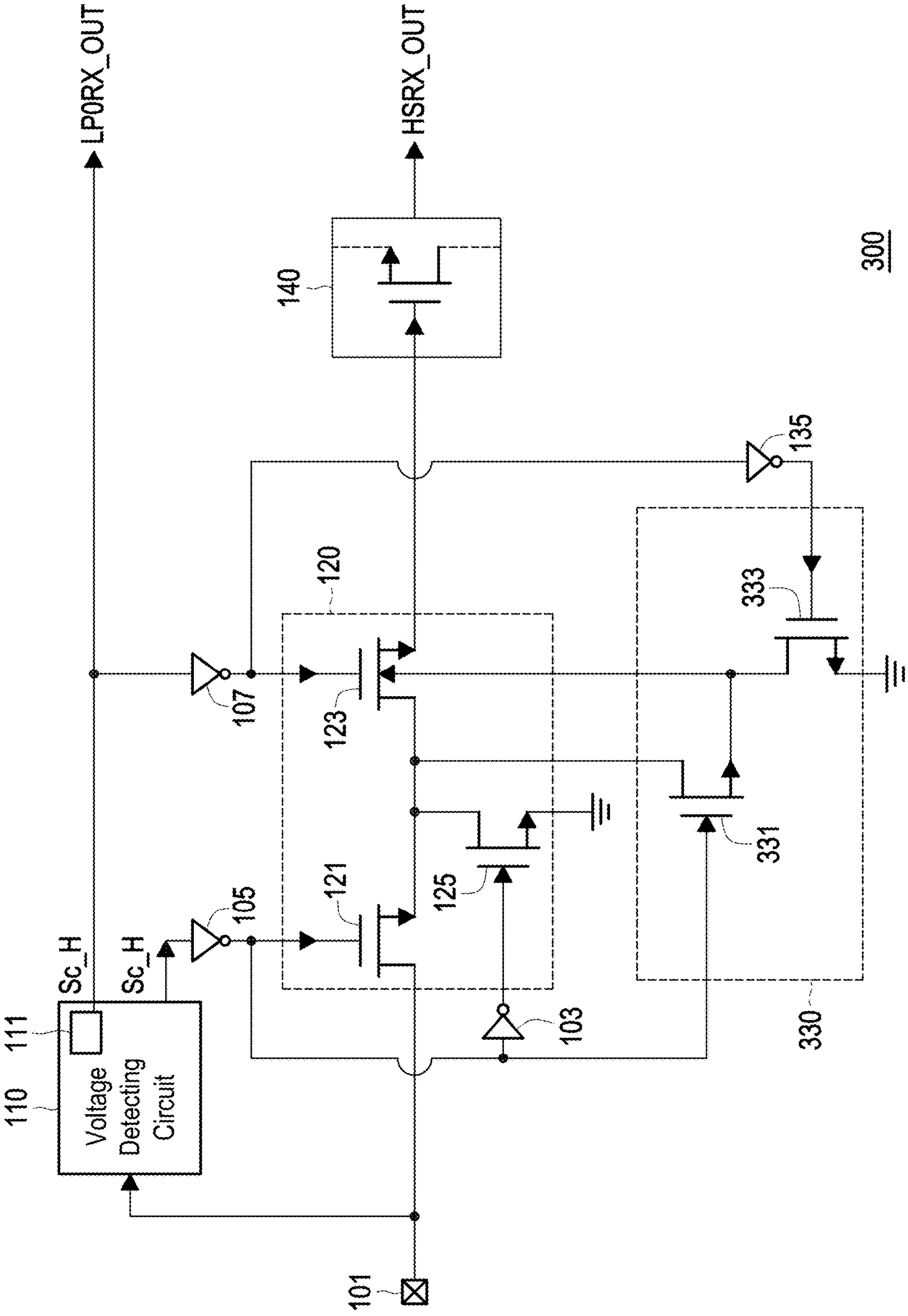
FIG. 3 is a diagram illustrating an analog front-end circuit of a display receiver according to an exemplary embodiment of the disclosure.

FIG. 3 is a diagram illustrating an analog front-end circuit 300 of a display receiver according to an exemplary embodiment of the disclosure. The structure and operations of the voltage detecting circuit 110, the switching circuit 120, and the equalizer 140 are similar to FIG. 1 as described above, and thus the description would not be repeated here. In the embodiment, a body clamping circuit 330 is included in the AFE circuit 300. The body clamping circuit 330 includes a third transistor 331 and a fourth transistor 333. With respect to embodiments of FIGS. 2A and 3, the third transistor 331 in FIG. 3 is a transistor having the same operation voltage as the first transistor 121 while the third transistor 231 in the body clamping circuit 230 of FIG. 2A is a transistor having the same operation voltage as the second transistor 123. As described above, the first transistor 121 has a higher operation voltage as compared to the second transistor 123. In the embodiment of FIG. 3, the third transistor 331 is capable of receiving higher voltage as to perform the body clamping function to the second transistor 123. The third transistor 331 includes a first terminal coupled to the first terminal of the second transistor 123, a second terminal coupled to a body terminal of the second transistor 123, and a control terminal coupled to the inverter 105 to receive the inverted first control signal Sc_H. The operation and functions of the body clamping circuit 330 is similar to the body clamping circuit 230 of FIG. 2A, and thus the description is not repeated here.

Figure 4:
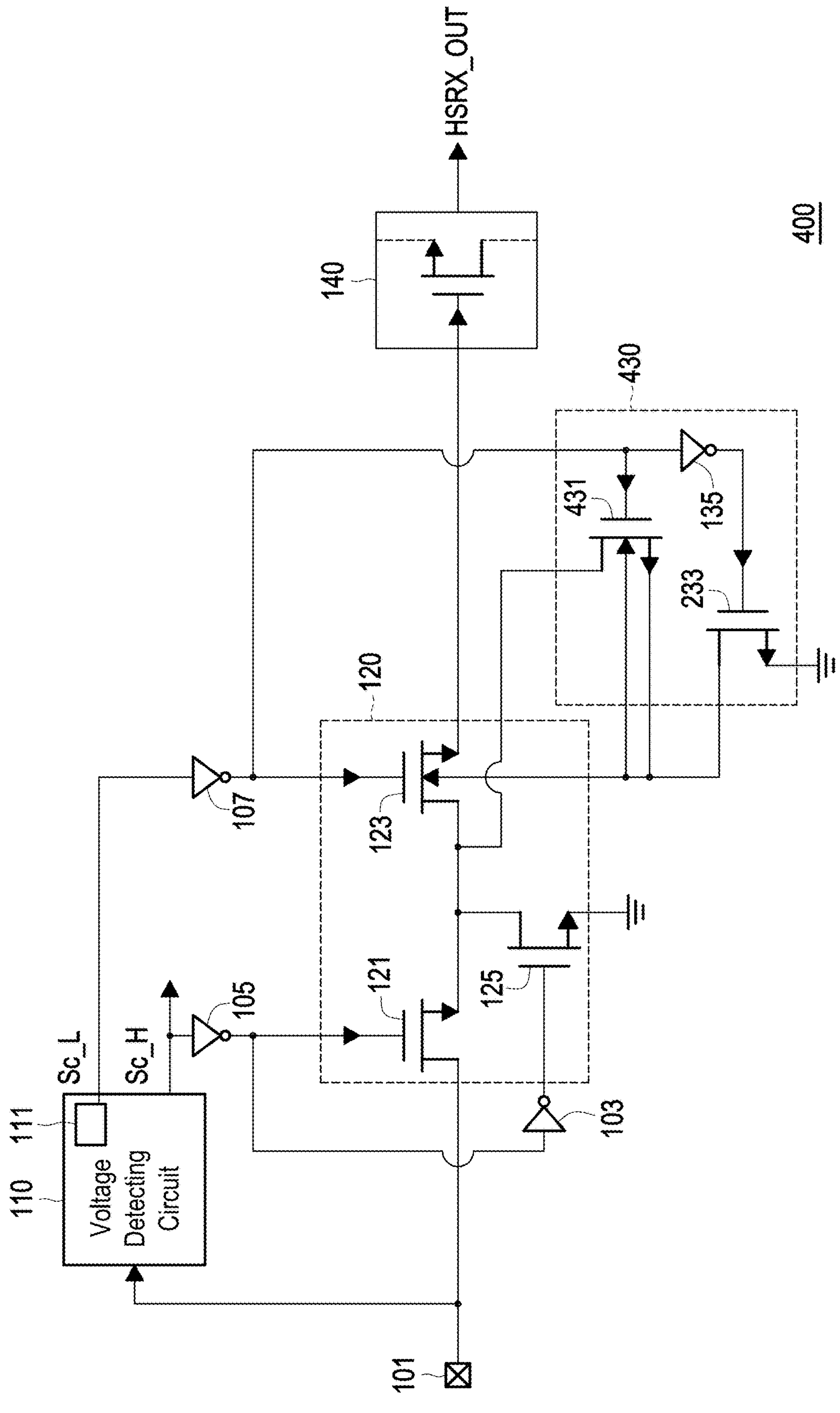
FIG. 4 is a diagram illustrating an analog front-end circuit of a display receiver according to an exemplary embodiment of the disclosure.

FIG. 4 is a diagram illustrating an analog front-end circuit 400 of a display receiver according to an exemplary embodiment of the disclosure. The structure and operations of the voltage detecting circuit 110, the switching circuit 120, and the equalizer 140 are similar to FIG. 1 as described above, and thus the description would not be repeated here. The AFE circuit 400 includes a body clamping circuit 430 having a third transistor 431 and the fourth transistor 233. With respect to the body clamping circuit 430 as illustrated in FIG. 4, the body clamp circuit 430 clamps the body terminal of the second transistor 123 to the first terminal of the second transistor 123. The third transistor 431 includes a first terminal coupled to the first terminal of the second transistor 123, a second terminal coupled to the body terminal of the second transistor 123, and a control terminal coupled to the inverter 107 to receive the inverted second control signal Sc_L. In the embodiment, the third transistor 431 further shorts a body terminal thereof to second terminal of the third transistor 431 and the body terminal of the second transistor 123.

Figure 5:
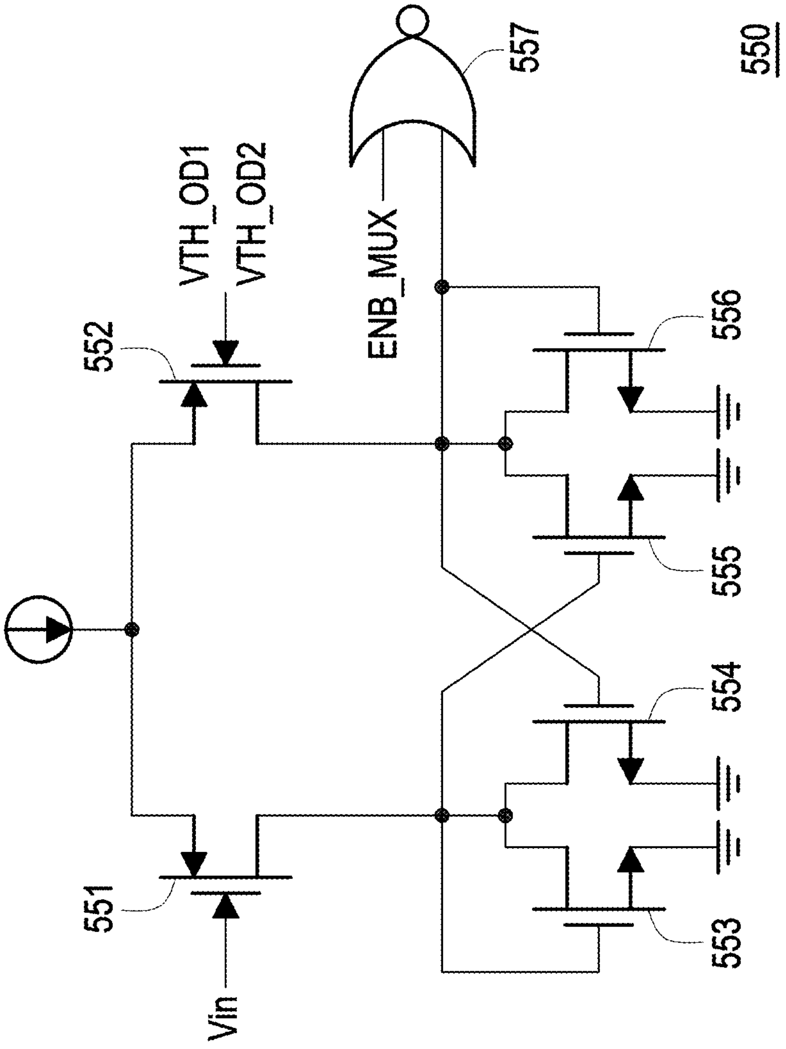
FIG. 5 is a diagram illustrating an analog front-end circuit of a display receiver according to an exemplary embodiment of the disclosure.

FIG. 5 is a diagram illustrating a comparator 550 according to an exemplary embodiment of the disclosure. Instead of utilizing a part of the low power receiving portion as a voltage detecting circuit for detecting voltage level of the input signal received at the input pad 101, the determination of whether an input signal Vin received at the input pad 101 may be performed by using the comparator 550. In the embodiment, the comparator 550 may be utilized to replace the voltage detecting circuit 110 as illustrated in FIG. 1 for determine whether the input signal is an input signal of low power mode or an input signal of high-speed mode, so as to enable or disable the switching circuit 120 for passing the input signal path of the high-speed receiving portion. The comparator 550 includes a plurality of transistors 551-556 and a XOR gate 557. The transistor 551 includes a control terminal coupled to the input signal Vin received from the input pad 101, a first terminal and a second terminal coupled a current source. The transistor 552 includes a control terminal coupled to the first and second predetermined voltages VTH_OD1, VTH_OD2, a first terminal and a second terminal coupled the current source. The transistor. The transistors 553, 554 forms a first pair of transistors. First terminals of the transistors 553, 554 are connected together forming a first common node that is coupled to the first terminal of the transistor 551. Second terminals of the transistors 553, 554 are coupled to the ground. The transistor 555, 556 forms a second pair of transistors. First terminals of the transistors 555, 556 are connected together forming a second common node that is coupled to the first terminal of the transistor 552. Second terminals of the transistors 553, 554 are coupled to the ground. The control terminal of the transistor 553 is coupled to first common node and the control terminal of the transistor 555. The control terminal of the transistor 554 is coupled to the second common node, control terminal of the transistor 556, and a first input of the XOR gate 557. The second input terminal of the XOR gate 557 is coupled to an enabling signal ENB_MUX which is constantly on when powered up. The output of the XOR 557 would a determination result of whether the input signal is an input signal of low power mode or an input signal of high-speed mode. As described above, the input signal is determined to be an input signal of low power mode when the voltage level of the input signal is higher than a first predetermined voltage VTH_OD1 (e.g., 0.74V). the input signal is determined to be an input signal of high-speed mode when the voltage level of the input signal is lower than to a second predetermined voltage (e.g., 0.55V). According to the comparison of the comparator 550, a control signal is generated to turn on or turn off the second transistor 123 which has a lower operation voltage as compared to the first transistor 121.

Figure 6:
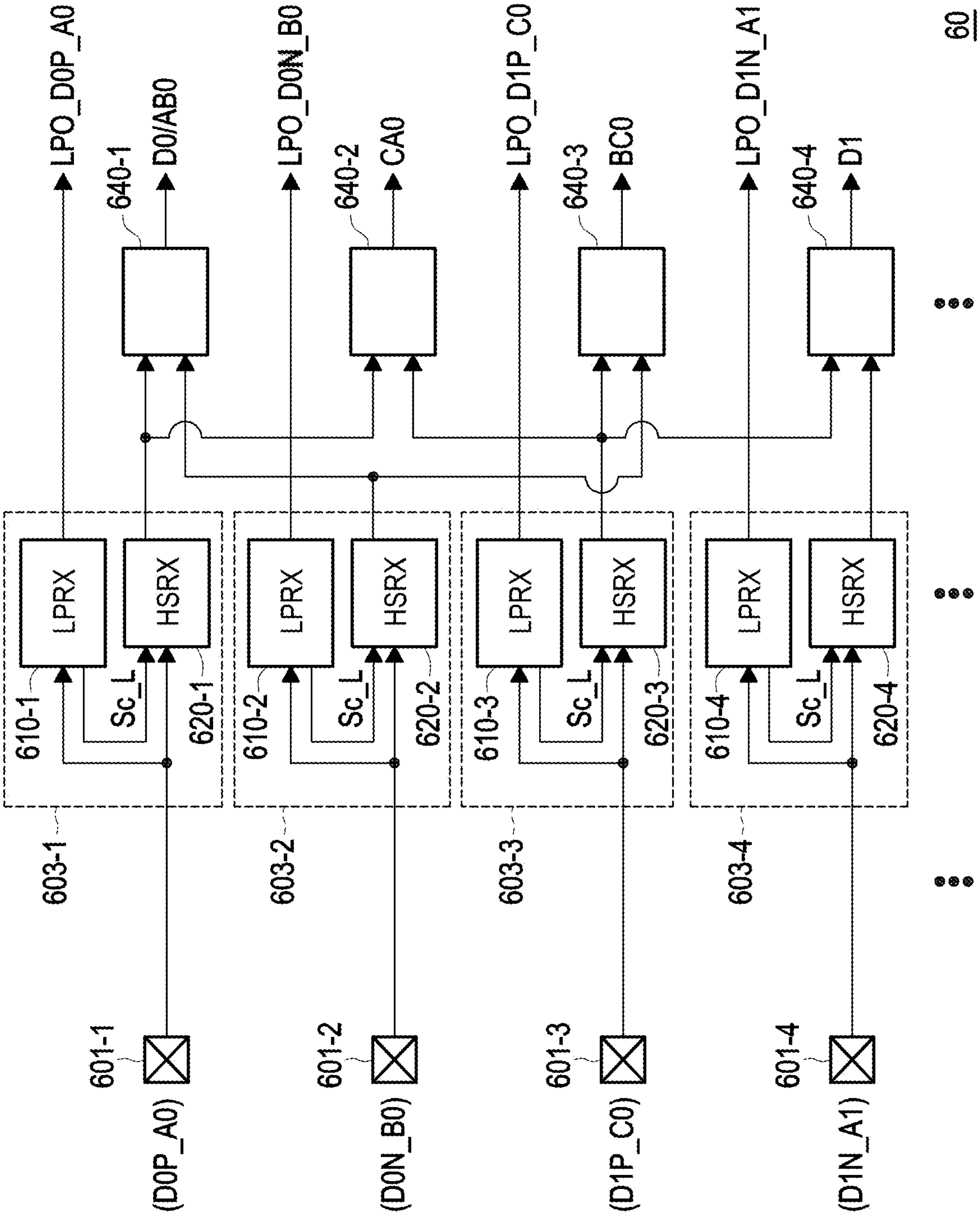
FIG. 6 is a diagram illustrating a display receiver according to an exemplary embodiment of the disclosure

FIG. 6 is a diagram illustrating a display receiver 60 according to an exemplary embodiment of the disclosure. In the MIPI protocol, a plurality of input channels are used for receiving the input signal of low power mode or input signal of high-speed mode. In the embodiment, the input signals are treated as a differential input signal pair in the high-speed mode of the D-physical layer (D-PHY) mode. On the other hand, the input signals are treated as a group of three input signals in the high-speed mode of the C-physical layer (C-PHY) mode. With reference to FIG. 6, input signals D0P_A0, D0N_B0, D1P_C0, D1N_A1 are illustrated. In the high-speed mode of the D-physical layer mode, the pair of the input signals D0P_A0, D0N_B0 are respectively received at input pads 601-1, 601-2 and regarded as a differential signal pair, and the pair of the input signals D1P_C0, D1N_A1 are respectively received by input pads 601-3, 601-4 and regard as an other differential signal pair. The differential input signal pair D0P_A0 and D0N_B0 are received by the receiving units 603-1 and 603-2 and processed by the equalizer circuit 640-1 to generate the output signal DO, and the differential input signal pair D1P_C0 and D1N_A1 are received by the receiving units 603-3 and 603-4 and processed by the equalizer circuit 640-4 to generate the output signal D1. In the high-speed mode of the C-physical layer mode, the combination of the input signals D0P_A0, D0N_B0, D1P_C0 forms a trio input signal in the high-speed mode which is received by the receiving units 603-1 to 603-3 and is processed by the equalizer circuits 640-1 to 640-3 to generate three output signals AB0, CA0, and BC0. On the other hand, in the low-power mode in the D-physical layer (D-PHY) mode and the low-power mode in the C-physical layer (C-PHY) mode, each input signal (D0P_A0, D0N_B0, D1P_C0, or D1N_A1 in FIG. 6) is regarded as a single-ended input signal, which is processed by the equalizer circuits 640-1 to 640-4 to generate the output signals LP0_D0P_A0, LP0_D0N_B0, LP0_D1P_C0, or LP0_D1N_A1.

In the embodiment, the display driver 60 includes a plurality of input pad 601-1, 601-2, 601-3, 601-4, a plurality of receiving portions 603-1, 603-2, 603-3, 603-4, and a plurality of equalizer circuits 640-1, 640-2, 640-3, 640-4. Each of the receiving portions 603-1, 603-2, 603-3, 603-4 includes a low power receiving portion 610-*x* (i.e., 610-1, 610-2, 610-3, 610-4) and a high-power receiving portion 620-*x* (i.e., 620-1, 620-2, 620-3, 620-4), where x is a number greater than 2. The low power receiving portion may be referred to as low power receiver LPRX. The high-speed receiving portion may be referred to as high-speed receiver HSRX. The structure and operation of the low power receiving portions 610-1, 610-2, 610-3, 610-4 are similar to the voltage detecting circuit 110 as described in the embodiment of FIG. 1. The structure and operation of the high-speed receiving portions 620-1, 620-2, 620-3, 620-4 are similar to the switching circuit 120 as described in the embodiment of FIG. 1. The structure and operation of the equalizer circuit 640-1, 640-2, 640-3, 640-4 are similar to the equalizer circuit 120 as described in the embodiment of FIG. 1. Therefore, the descriptions of the low power receiving portions 610-1, 610-2, 610-3, 610-4 and the high-power receiving portion 620-1, 620-2, 620-3, 620-4, and the equalizer circuit 640-1, 640-2, 640-3, 640-4 would not be repeated here for the purpose of brevity.

In the embodiment, there are a plurality of input receiving channels, each of the input receiving channels include a corresponding low power receiving portion 610-*x*, a corresponding high-speed receiving portion 620-*x*, and a corresponding equalizer circuit 640-*x*. It should be noted that the lower power receiving portion 610-*x* is directly or indirectly coupled to the high-speed receiving portion 620-*x* in the display driver 60, so that a part of lower power receiving portion 610-*x* is utilized to detect a voltage level of the input signal received from the corresponding input pad 601-*x* (i.e., a voltage detecting circuit). The detection result is transmitted to the high-speed receiving portion for turning off a part of the high-speed receiving portion as to provide over-voltage protection to those transistors (or electrical components) that have a rated voltage lower than the voltage level of the low power mode. Any of the AFE circuits 100, 200, 300, 400 as illustrated in FIGS. 1-4 may be utilized as the input receiving channels as illustrated in FIG. 6. Each input receiving channel operates in a similar manner as the embodiments illustrated in FIGS. 1-4, and therefore, the detail description thereof are not repeated here for the purpose of brevity.

Based on the embodiments as described above, the over-voltage protection of the transistors (or other electrical components) at downstream of signal path after the first transistor that is directly coupled to the input pad of the display driver may be achieved. Accordingly, the transistors having lower operation voltage rating may be used at the downstream of the signal path, which reduces physical dimension of the analog front-end circuit and display driver. Furthermore, smaller transistor also provides the advantages of faster data rate and lower power consumption.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions. The previously described exemplary embodiments of the present invention have the advantages aforementioned, wherein the advantages aforementioned not required in all versions of the disclosure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An analog front-end (AFE) circuit of a display receiver compatible with Mobile Industry Processor Interface standard, configured to receive an input signal, comprising:

an equalizer circuit;

an input pad, receiving the input signal;

a voltage detecting circuit, coupled to the input pad, configured to receive the input signal and generate a control signal according to a voltage level of the input signal; and a switching circuit, coupled to the voltage detecting circuit and between the input pad and the equalizer circuit, and configured to receive the input signal, and determine whether to pass the input signal from the input pad to the equalizer circuit according to the control signal, wherein the control signal includes two different voltage levels that are respectively corresponding to a high-speed mode and a low power mode, wherein the voltage detecting circuit is configured to output the control signal whose voltage level indicates that the display receiver is in the low power mode when the voltage level of the input signal is higher than a first predetermined voltage, and output the control signal whose voltage level indicates that the display receiver is in the high-speed mode when the voltage level of the input signal is lower than to a second predetermined voltage, and wherein the first predetermined voltage is greater than the second predetermined voltage.

2. The AFE circuit of claim 1, wherein the switching circuit is configured to stop the input signal received from the input pad from being transmitted to the equalizer circuit in response to receipt of the control signal whose voltage level indicates that the display receiver is in the low power mode.

3. The AFE circuit of claim 1, wherein the switching circuit comprises a first transistor and a second transistor having a lower operation voltage with respect to the first transistor, and the first transistor is coupled to the input pad for receiving the input signal, the second transistor is coupled between the first transistor and the equalizer circuit, and a control terminal of the first transistor and a control terminal of the second transistor are respectively coupled to the voltage detecting circuit.

4. The AFE circuit of claim 3, further comprising:

a body clamping circuit, including a third transistor having a control terminal coupled to an output of the voltage detecting circuit, and configured to clamp a body terminal of the second transistor to a voltage level at a first terminal of the second transistor according to the input signal.

5. The AFE circuit of claim 4, wherein the body clamping circuit further includes a fourth transistor having a control terminal coupled to the output of the voltage detecting circuit, and configured to clamp the body terminal of the second transistor to a ground according to the input signal.

6. The AFE circuit of claim 3, wherein the equalizer circuit includes a plurality of transistors having a lower operation voltage with respect to the first transistor.

7. The AFE circuit of claim 1, wherein the voltage detecting circuit includes a voltage comparator configured to output an enable signal according to a voltage of the input signal and a predetermined reference voltage.

8. The AFE circuit of claim 1, wherein the voltage detecting circuit further comprises a level shift circuit configured to shift a voltage level of the control signal which is generated based on the input signal to an operation voltage range of at least one transistor included in the switching circuit.

9. The AFE circuit of claim 1, further comprising:

a high-speed receiving portion, including the switching circuit and the equalizer; and a low power receiving portion, including the voltage detecting circuit; and a voltage converter, coupled between the voltage detecting circuit and the switching circuit, and configured to convert a voltage level of the control signal from first voltage level to second voltage level.

10. The AFE circuit of claim 1, wherein the switching circuit comprises:

a first transistor, including a control terminal coupled to an output of the voltage detecting circuit, a first terminal coupled to the input pad, and a second terminal; and a second transistor, including a control terminal coupled to the output of the voltage detecting circuit, a first terminal coupled to the second terminal of the first transistor, and a second terminal coupled to the equalizer circuit, wherein an operation voltage of the second transistor is lower than an operation voltage of the first transistor.

11. The AFE circuit of claim 10, further comprising:

a third transistor, including a control terminal directly connected to the control terminal of the second transistor, a first terminal coupled to the second terminal of the second transistor, and a second terminal coupled to a body terminal of the second transistor.

12. The AFE circuit of claim 11, wherein the third transistor further includes a body terminal that is short-circuited with the second terminal of the third transistor.

13. The AFE circuit of claim 10, further comprising:

a third transistor, including a control terminal directly connected to the control terminal of the first transistor, a first terminal coupled to the first terminal of the second transistor, and a second terminal coupled to a body terminal of the second transistor.

* * * * *